(12) United States Patent
Yanagita et al.

(10) Patent No.: US 11,791,368 B2
(45) Date of Patent: Oct. 17, 2023

(54) IMAGE PICKUP ELEMENT, IMAGE PICKUP APPARATUS, AND METHOD OF MANUFACTURING IMAGE PICKUP ELEMENT

(71) Applicant: Sony Corporation, Tokyo (JP)

(72) Inventors: Takeshi Yanagita, Tokyo (JP); Yasushi Tateshita, Kanagawa (JP); Kazunobu Ota, Tokyo (JP)

(73) Assignee: Sony Corporation, Tokyo (JP)

( * ) Notice: Subject to any disclaimer, the term of this patent is extended or adjusted under 35 U.S.C. 154(b) by 512 days.

(21) Appl. No.: 16/907,640

(22) Filed: Jun. 22, 2020

(65) Prior Publication Data

US 2020/0321389 A1    Oct. 8, 2020

Related U.S. Application Data

(63) Continuation of application No. 15/512,246, filed as application No. PCT/JP2015/072304 on Aug. 6, 2015, now Pat. No. 10,825,858.

(30) Foreign Application Priority Data

Sep. 24, 2014    (JP) ................. 2014-193497

(51) Int. Cl.
*H01L 27/146*    (2006.01)
*H01L 27/148*    (2006.01)
*H04N 25/76*    (2023.01)

(52) U.S. Cl.
CPC .... *H01L 27/14692* (2013.01); *H01L 27/1464* (2013.01); *H01L 27/14605* (2013.01);
(Continued)

(58) Field of Classification Search
CPC ......... H01L 27/14692; H01L 27/14623; H01L 27/14627; H01L 27/1464; H01L 27/14649;
(Continued)

(56) References Cited

U.S. PATENT DOCUMENTS 10,700,115 B2 *    6/2020    Choi ................. H01L 27/14609
2003/0132450 A1    7/2003    Minato et al.
(Continued)

FOREIGN PATENT DOCUMENTS

EP    1363332 A1    11/2003
JP    6-140609 A    5/1994
(Continued)

OTHER PUBLICATIONS

U.S. Appl. No. 15/512,246, filed Mar. 17, 2017, Yanagita et al.
(Continued)

*Primary Examiner* — Omar F Mojaddedi
(74) *Attorney, Agent, or Firm* — Wolf, Greenfield & Sacks, P.C.

(57)    ABSTRACT

Image quality is improved.
In an image pickup element, an interval between adjacent light receiving elements on a light receiving surface is changed depending on a position on the light receiving surface. Further, the image pickup element is manufactured by a method of manufacturing the image pickup element including layering photodiodes by repeatedly performing a silicon epitaxial process and an ion injection process. Further, the image pickup element is manufactured by the method of manufacturing the image pickup element including changing an interval between the photodiodes adjacent on the light receiving surface of the image pickup element in each layer depending on a position on the light receiving surface in addition to the layering thereof.

5 Claims, 14 Drawing Sheets

(52) U.S. Cl.
CPC .. *H01L 27/14623* (2013.01); *H01L 27/14627* (2013.01); *H01L 27/14643* (2013.01); *H01L 27/14649* (2013.01); *H01L 27/14685* (2013.01); *H01L 27/14689* (2013.01); *H04N 25/76* (2023.01); *H01L 27/148* (2013.01); *H01L 27/14621* (2013.01)

(58) Field of Classification Search
CPC ......... H01L 27/14685; H01L 27/14689; H01L 27/14621; H01L 27/148
See application file for complete search history.

(56) References Cited

U.S. PATENT DOCUMENTS

| | | | |
|---|---|---|---|
| 2005/0048701 A1 | 3/2005 | Minato et al. | |
| 2015/0380450 A1* | 12/2015 | Okamoto | H01L 27/14603 257/43 |
| 2016/0035780 A1* | 2/2016 | Itahashi | H04N 25/75 257/432 |
| 2016/0049438 A1* | 2/2016 | Murata | H01L 27/14623 257/229 |
| 2016/0071893 A1* | 3/2016 | Shinohara | H01L 27/14627 257/432 |
| 2016/0372509 A1* | 12/2016 | Sekikawa | H01L 27/14636 |
| 2017/0287976 A1 | 3/2017 | Yanagita et al. | |

FOREIGN PATENT DOCUMENTS

| | | | |
|---|---|---|---|
| JP | 2006-261249 A | | 9/2006 |
| JP | 2010-118479 A | | 5/2010 |
| JP | 2010118479 A | * | 5/2010 |
| JP | 2012-070006 A | | 4/2012 |
| JP | 2013-038383 A | | 2/2013 |
| WO | WO 2002/067333 A1 | | 8/2002 |

OTHER PUBLICATIONS

International Search Report and Written Opinion and English translation thereof dated Oct. 27, 2015 in connection with International Application No. PCT/JP2015/072304.

International Preliminary Report on Patentability and English translation thereof dated Apr. 6, 2017 in connection with International Application No. PCT/JP2015/072304.

* cited by examiner a b

Mark formation process

Resist formation process

Resist stripping process

IMAGE PICKUP ELEMENT, IMAGE PICKUP APPARATUS, AND METHOD OF MANUFACTURING IMAGE PICKUP ELEMENT

CROSS-REFERENCE TO RELATED APPLICATIONS

The present application claims the benefit under 35 U.S.C. § 120 as a continuation application of U.S. application Ser. No. 15/512,246, filed on Mar. 17, 2017, now U.S. Pat. No. 10,825,858, which is a National Stage of International Application No. PCT/JP2015/072304, filed in the Japanese Patent Office as a Receiving office on Aug. 6, 2015, which claims priority to Japanese Patent Application Number 2014-193497, filed in the Japanese Patent Office on Sep. 24, 2014, each of which is hereby incorporated by reference in its entirety.

TECHNICAL FIELD

The present technology relates to an image pickup element. Specifically, the present technology relates to an image pickup element that generates image data, an image pickup apparatus, and a method of manufacturing an image pickup element.

BACKGROUND ART

In related art, an image pickup element that takes an image of a subject and generates image data thereof exists. For example, image pickup elements such as a CMOS (Complementary Metal Oxide Semiconductor) and a CCD (Charge Coupled Device) are in widespread use.

Further, for example, there has been proposed such an image pickup element that positions where sensor separation layers are formed are set to be different depending on travelling directions of light that enters a substrate between a pixel area center portion and a pixel area peripheral portion (see, for example, Patent Literature 1).

CITATION LIST

Patent Literature

Patent Literature 1: Japanese Patent Application Laid-open No. 2010-118479

DISCLOSURE OF INVENTION

Technical Problem

In related art described above, by setting the positions where the sensor separation layers to be different, color mixing can be suppressed.

Further, for example, it is important to suppress color mixing and shading by pupil correction or the like, and improve the image quality of image data generated by an image pickup element.

The present technology has been made in view of the circumstances as described above and has an object to improve image quality.

Solution to Problem

According to a first aspect of the present technology, there is provided an image pickup element, in which an interval between adjacent light receiving elements on a light receiving surface is changed depending on a position on the light receiving surface. With this structure, an effect of generating image data by the image pickup element in which the interval between the adjacent light receiving elements on the light receiving surface is changed depending on the position on the light receiving surface is obtained.

Further, according to the first aspect, the image pickup element may be a back-surface irradiation type COMS (Complementary Metal Oxide Semiconductor) sensor, in which the light receiving elements may be formed in such a manner that the adjacent light receiving elements are arranged at an equal interval on a pixel transistor side, and the light receiving elements may be formed in such a manner that the adjacent light receiving elements are arranged at different intervals depending on positions on the light receiving surface on a light incident side. With this structure, obtained is an effect of generating image data by the back-surface irradiation type CMOS sensor in which on the pixel transistor side, the light receiving element is formed in such a manner that the interval between the adjacent light receiving elements is equal, and on the light incident side, the light receiving element is formed in such a manner that the adjacent light receiving elements are arranged at different intervals depending on the position on the light receiving surface.

Further, according to the first aspect, the light receiving elements may be formed along light paths of light incident from opening portions of the light receiving elements. With this structure, obtained is an effect of generating image data by the image pickup element in which the light receiving elements are formed along the light path of light incident from opening portions of the light receiving elements.

Further, according to the first aspect, the light receiving elements may be divided into pieces and silicon-epitaxially formed. As a result, obtained is an effect that image data is generated by the image pickup element in which the light receiving elements are divided into pieces and formed by the silicon epitaxial process.

Further, according to the first aspect, the intervals between the adjacent light receiving elements may be linearly or nonlinearly changed from a center of the light receiving surface toward field angle ends. With this structure, obtained is an effect of generating image data by the image pickup element in which the intervals between the adjacent light receiving elements are linearly or nonlinearly changed from the center of the light receiving surface toward field angle ends.

Further, according to the first aspect, an interval between inter-pixel light shielding films disposed between the adjacent light receiving elements may be changed depending on a position on the light receiving surface. With this structure, obtained is an effect of generating image data by the image pickup element in which the interval between inter-pixel light shielding films disposed between the adjacent light receiving elements is changed depending on the position on the light receiving surface.

Further, according to the first aspect, an interval between lenses disposed on the light receiving elements may be changed depending on a position on the light receiving surface. With this structure, obtained is an effect of generating image data by the image pickup element in which the interval between the lenses disposed on the light receiving elements is changed depending on the position on the light receiving surface.

Further, according to a second aspect of the present technology, there is provided a method of manufacturing an image pickup element, including: layering photodiodes by repeatedly performing a silicon epitaxial process and an ion injection process; and changing an interval between the photodiodes adjacent on a light receiving surface of an image pickup element in each layer depending on a position on the light receiving surface. As a result, obtained is an effect of layering the photodiodes by repeatedly performing the silicon epitaxial process and the ion injection process and changing the interval between the photodiodes adjacent on the light receiving surface of the image pickup element in each layer depending on the position on the light receiving surface.

Advantageous Effects of Invention

According to the present technology, it is possible to exert the excellent effect that the image quality can be improved. It should be noted that, the effects described here are not limited, and any effect described in this disclosure may be obtained.

MODE(S) FOR CARRYING OUT THE INVENTION

Hereinafter, modes for carrying out the present technology (hereinafter, referred to as embodiments) will be described. The description will be given in the following order.
1. First embodiment (example of image pickup element such as back-surface irradiation type CMOS sensor)
2. Second embodiment (example of image pickup element such as front-surface irradiation type CMOS sensor)
3. Third embodiment (example of image pickup element of multilayer silicon epitaxial of three or more layers)

1. First Embodiment

[Configuration Example of Image Pickup Element]

Figure 1:
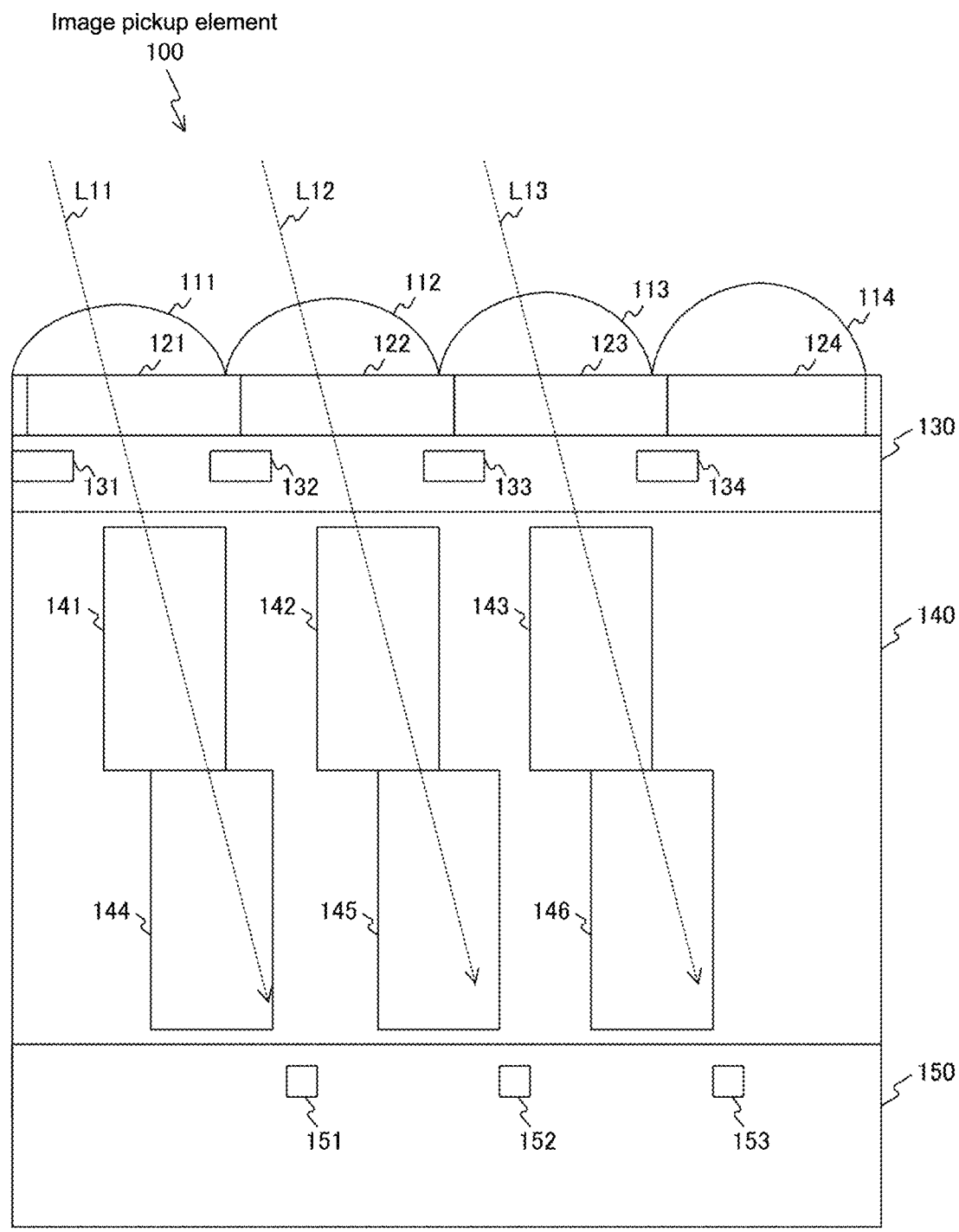
FIG. 1 A cross-sectional view showing a configuration example of an image pickup element 100 according to a first embodiment of the present technology.

FIG. 1 is a cross-sectional view showing a configuration example of an image pickup element 100 according to a first embodiment of the present technology. FIG. 1 shows the configuration example of a peripheral portion of the image pickup element 100 (area on a peripheral side on a light reception surface).

The image pickup element 100 is provided with OCLs (On Chip Lenses) 111 to 114, OCCFs (On Chip Color Filters) 121 to 124, inter-pixel light shielding films 131 to 134, photodiodes 141 to 146, and pixel transistors 151 to 153. The image pickup element 100 is achieved by a back-surface irradiation type COMS (Complementary Metal Oxide Semiconductor) sensor, for example.

The OCLs 111 to 114 are micro lenses disposed above pixels, and collect light from a subject to the photodiodes 141 to 146.

The OCCFs 121 to 124 are color filters disposed above the pixels, and the pixels obtain color information corresponding to the OCCFs disposed thereabove.

The inter-pixel light shielding films 131 to 134 are light shielding films formed along a boundary between adjacent pixels. The inter-pixel light shielding films 131 to 134 are made of a material that shields light.

The photodiodes 141 to 146 are light receiving elements that receive light collected by the OCLs 111 to 114.

The pixel transistors 151 to 153 are reading transistors used when pixel data accumulated by receiving light by the photodiodes 141 to 146 is read.

Figure 2:
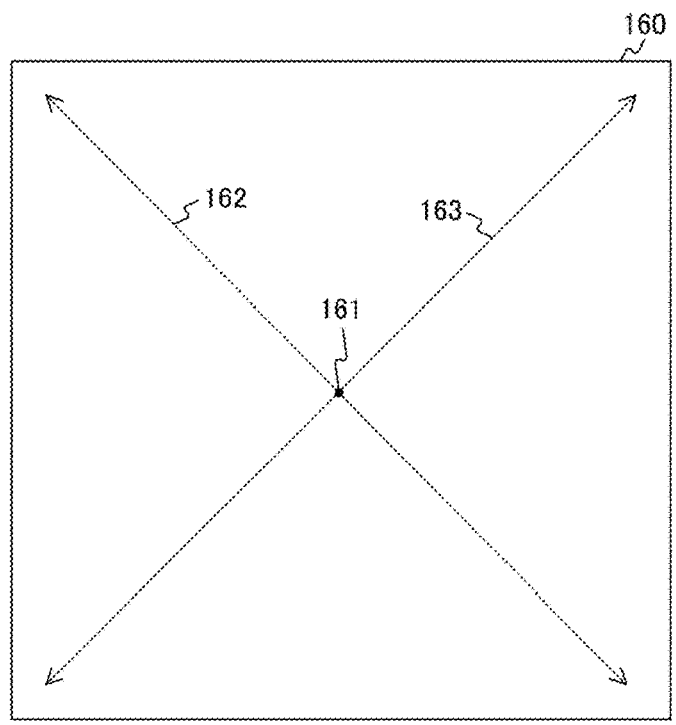
FIG. 2 Top plan views each showing a configuration example of the image pickup element 100 according to the first embodiment of the present technology.
Figure 2:
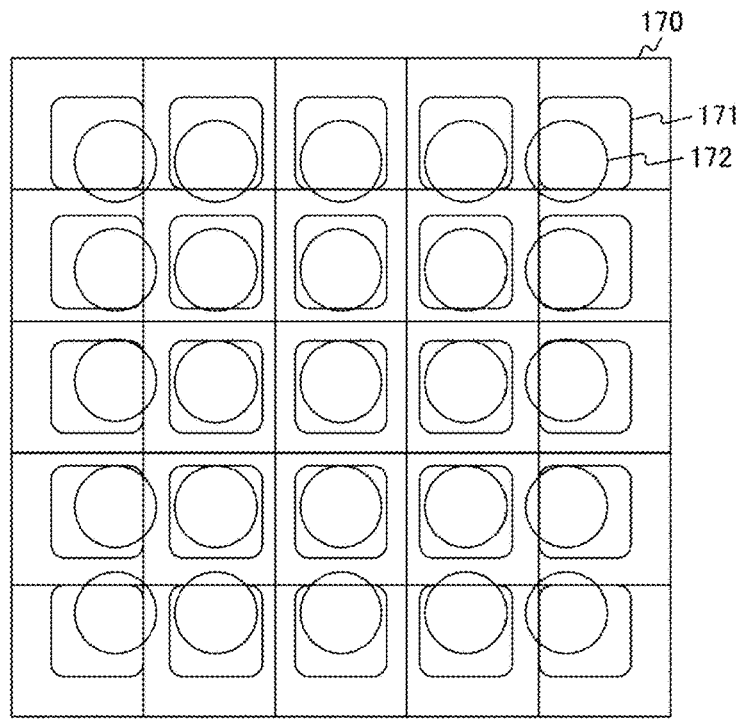

FIG. 2 shows top plan views each showing a configuration example of the image pickup element 100 according to the first embodiment of the present technology.

In a of FIG. 2, a pixel area 160 in the case of viewing the image pickup element 100 from above is simply shown. It should be noted that, in a of FIG. 2, for ease of explanation, the pixel area 160 of the image pickup element 100 is shown as a substantially square rectangle.

In b of FIG. 2, a relationship between photodiode opening portions and the OCLs in the case of viewing the image pickup element 100 from above. It should be noted that, in b of FIG. 2, for ease of explanation, the number of pixels that constitute the image pickup element 100 is set to only 25, and the pixels are schematically shown by rectangles. Further, the photodiode opening portions in the pixels are shown by substantially rectangles (shapes obtained by rounding off four corners of the rectangles), and the OCLs are shown by circles. For example, in a pixel 170, a photodiode opening portion 171 and an OCL 172 are disposed.

As shown in b of FIG. 2, from the center of a pixel area toward field angle ends thereof, the areas of the photodiode opening portions 171 are shifted linearly (or nonlinearly) in the pixels 170. For example, as shown in a of FIG. 2, from a center 161 of the pixel area 160 in directions indicated by arrows 162 and 163, the areas of the photodiode opening portions 171 are shifted linearly. For example, shift amounts of the areas of the photodiode opening portions 171 can be increased (for example, increase based on a predetermined rule (for example, monotone increase)) as shifted from the center 161 to the arrows 162 and 163 directions.

Further, for example, as shifted from the center 161 of the pixel area 160 to the arrows 162 and 163 directions, at least a part of the areas of the photodiode opening portions 171 may be nonlinearly shifted. For example, the shift amount of the part of the areas of the photodiode opening portions 171 is increased (for example, increase based on a predetermined rule as shifted from the center 161 to the arrows 162 and 163 directions), and the shift amount of the remaining area thereof can be a fixed value.

That is, interval between the adjacent photodiodes on the light receiving surface of the image pickup element 100 are changed linearly (or nonlinearly) toward the field angle ends from the center on the light receiving surface.

Further, as shown in FIG. 1 and FIG. 2, the intervals between the adjacent photodiodes on the light receiving surface of the image pickup element 100 are changed in accordance with positions on the light receiving surface of the image pickup element 100.

For example, the case where the image pickup element 100 is the back-surface irradiation type COMS sensor is assumed. In this case, on the pixel transistor side, the photodiodes are formed in such a manner that intervals between the adjacent photodiodes on the light receiving surface of the image pickup element 100 are equal. Further, on the light incident side, the photodiodes are formed in such a manner that intervals of the adjacent photodiodes on the light receiving surface of the image pickup element 100 are different depending on positions on the light receiving surface. In this case, as shown in FIG. 1, the photodiodes are formed along a light path of light that is incident from the opening portions. Further, the photodiodes are divided into pieces and silicon-epitaxially formed.

Further, as shown in FIG. 1, intervals between the inter-pixel light shielding films 131 to 134 disposed between the adjacent photodiodes on the light receiving surface of the image pickup element 100 are changed depending on positions on the light receiving surface. Further, as shown in FIG. 1 and FIG. 2, the intervals between the lenses (OCLs 111 to 114 and OCCFs 121 to 124) disposed on the image pickup element 100 are changed depending on positions on the light receiving surface.

As described above, for the portions (OCLs, OCCFs, inter-pixel light shielding films, and photodiodes) that constitute the image pickup element 100, pupil correction can be performed. Here, the pupil correction is correction performed with respect to an exit pupil distance in accordance with a position of an image taking surface (see, for example, Japanese Patent Application Laid-open No. 2004-56260).

For example, in an optical system of the CMOS sensor, used is such an aspherical lens that, in a center portion of the image taking surface, the exit pupil distance appears to be short, and in a peripheral portion of the image taking surface, the exit pupil distance appears to be long. Further, in the case where the aspherical lens is used, toward the peripheral portion from the center portion on the image taking surface, the exit pupil distance is monotonously increased. In this way, depending on positions on the image taking surface, the exit pupil distance varies. For this reason, it is necessary to perform correction (pupil correction) for the exit pupil distance.

For example, the case is assumed in which the exit pupil distance on the center on the image taking surface is set as d1, the exit pupil distance on an end portion on the image taking surface is set as d2, and the exit pupil distance is monotonously increased. In this case, it is possible to perform pupil correction for an exit pupil distance d that satisfies the relationship of $(d1+d2)/2<d<d2$.

[Example of Manufacturing Process of Image Pickup Element]

FIG. 3 to FIG. 10 are diagrams each showing an example of a manufacturing process of the image pickup element 100 according to the first embodiment of the present technology. FIG. 3 to FIG. 10 show examples in which a silicon epitaxial process and an ion injection process are repeatedly performed, to increase the thickness of a silicon film of the photodiode. As a result, it is possible to increase sensitivity.

Figure 5:
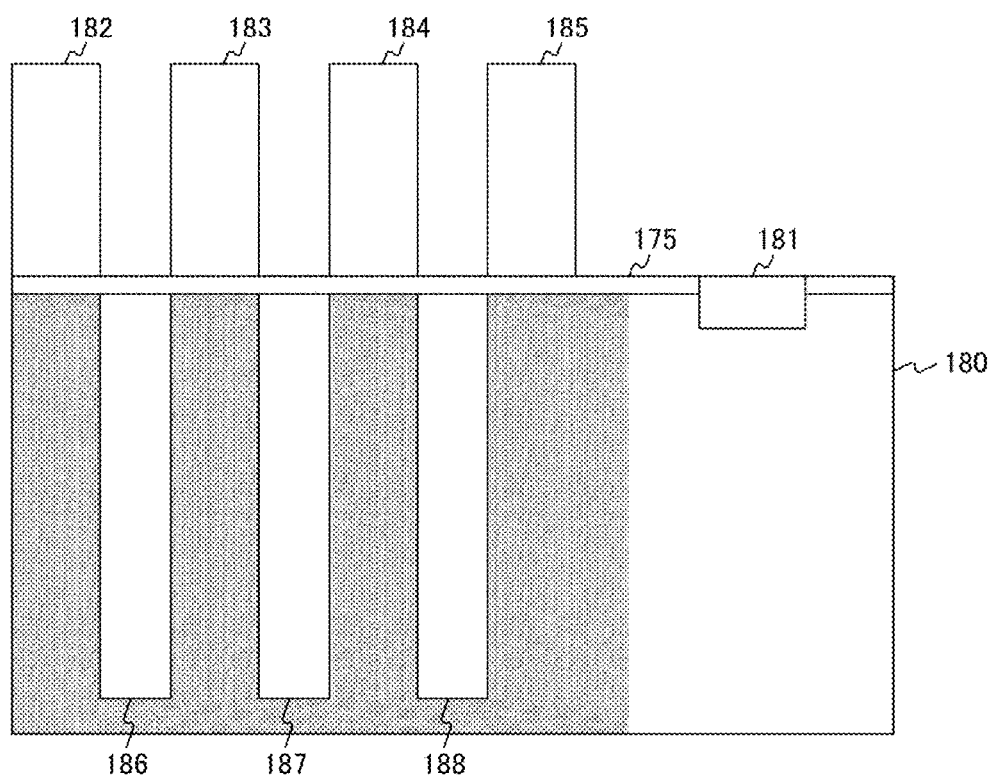
FIG. 5 A diagram showing an example of a manufacturing process of the image pickup element 100 according to the first embodiment of the present technology.
Figure 6:
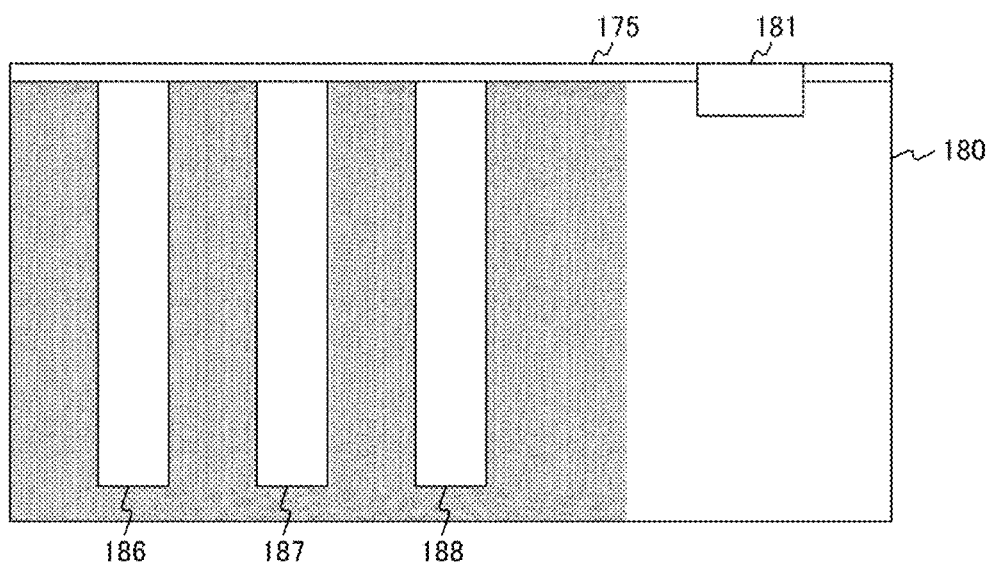
FIG. 6 A diagram showing an example of a manufacturing process of the image pickup element 100 according to the first embodiment of the present technology.
Figure 7:
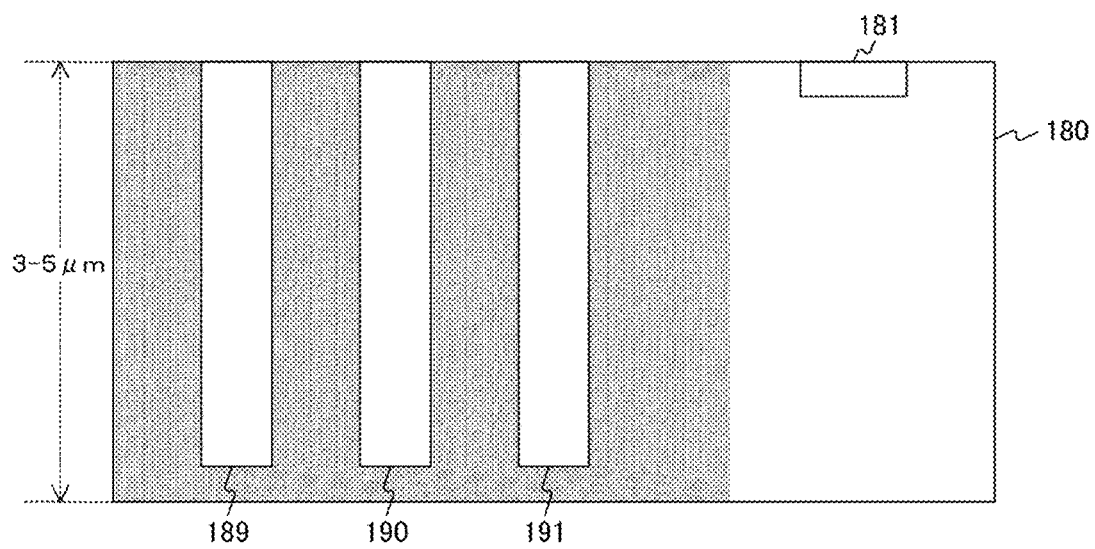
FIG. 7 A diagram showing an example of a manufacturing process of the image pickup element 100 according to the first embodiment of the present technology.

FIG. 3 to FIG. 7 show a first photodiode formation process. For example, as shown in FIG. 7, first photodiodes 189 to 191 and a trench shape 181 are formed in a silicon wafer 180.

Figure 3:
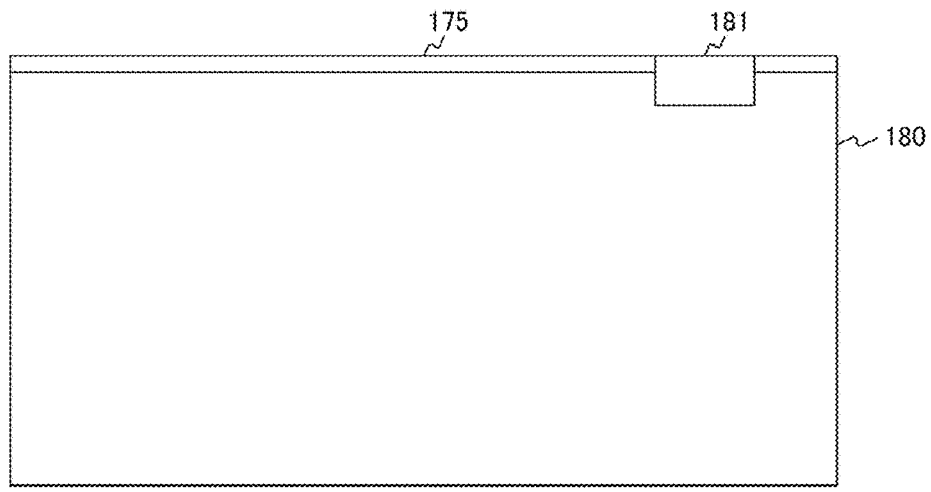
FIG. 3 A diagram showing an example of a manufacturing process of the image pickup element 100 according to the first embodiment of the present technology.

FIG. 3 shows a mark formation process. For example, a surface of the silicon wafer 180 is oxidized to form an oxide film 175. Then, a photolithography process is performed, and dry etching is performed, with the result that the trench shape 181 is formed in the silicon wafer 180.

Figure 4:
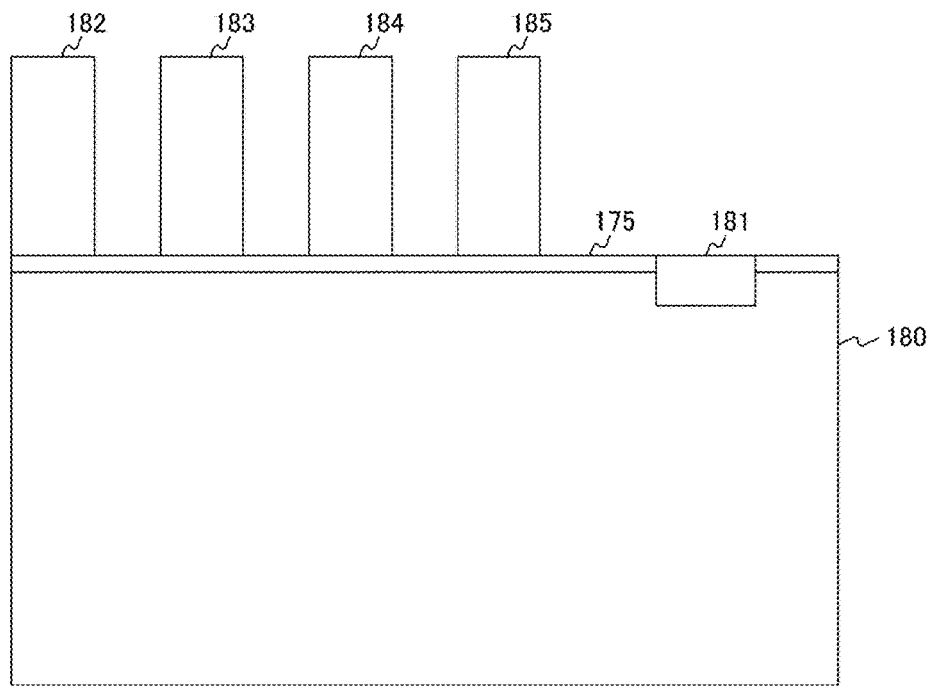
FIG. 4 A diagram showing an example of a manufacturing process of the image pickup element 100 according to the first embodiment of the present technology.

FIG. 4 shows a resist formation process. For example, by performing the photolithography process, on the silicon wafer 180, resists 182 to 185 are formed.

FIG. 5 shows an ion injection process. For example, by performing an ion injection, in the silicon wafer 180, N-type regions 186 to 188 of the photodiode are formed. Further, FIG. 5 shows a grayed region as a P-type region. It should be noted that the P-type region and the N-type region are formed by performing the ion injection after patterning.

FIG. 6 shows a resist stripping process. For example, by performing the resist stripping process, the resists 182 to 185 formed on the silicon wafer 180 are stripped.

FIG. 7 shows an oxide film stripping process and an epitaxial (silicon epitaxial) process. For example, by performing the oxide film stripping process, from the silicon wafer 180, the oxide film 175 is stripped. Subsequently, the silicon epitaxial process is performed, thereby forming the first photodiodes 189 to 191.

Figure 8:
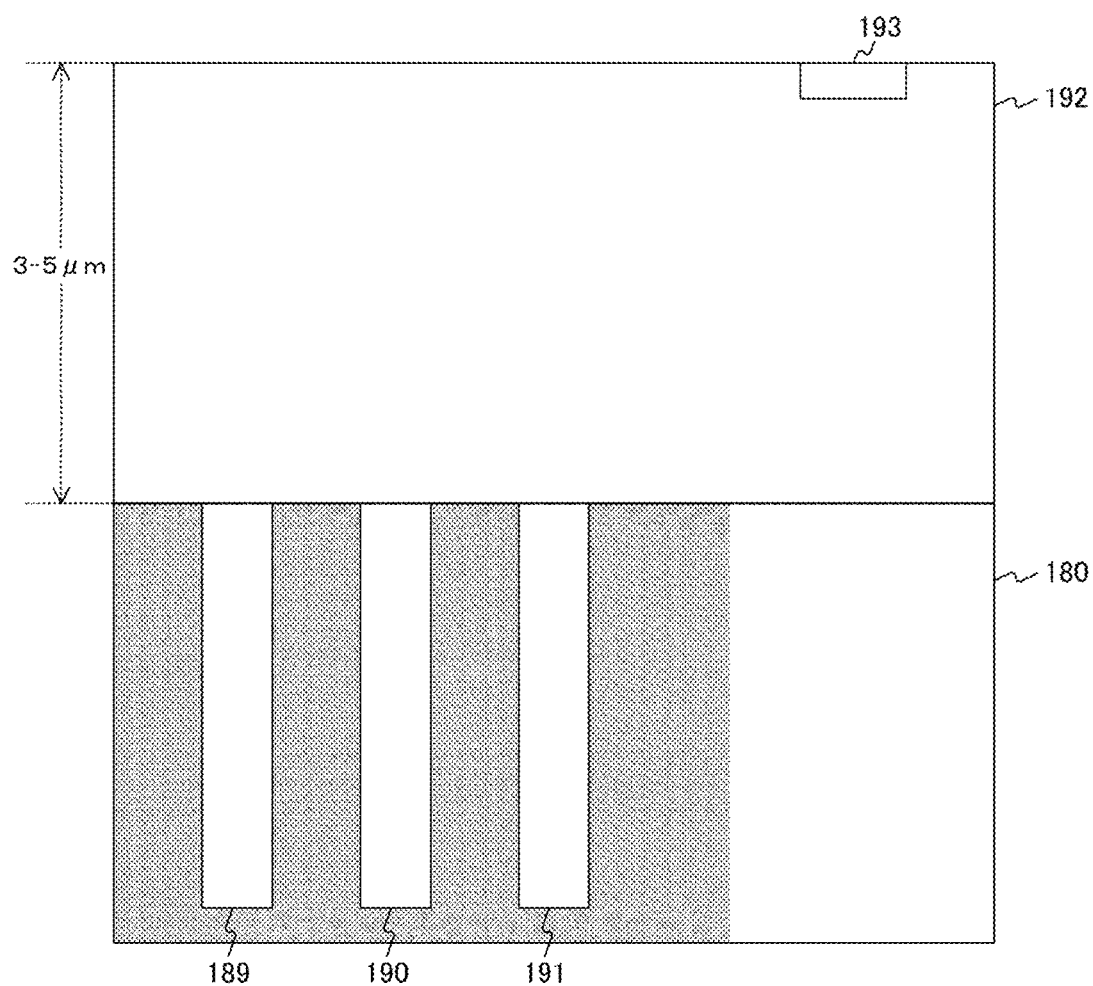
FIG. 8 A diagram showing an example of a manufacturing process of the image pickup element 100 according to the first embodiment of the present technology.

FIG. 8 shows a silicon epitaxial process. For example, an epitaxial layer 192 is formed. Further, in the trench of the trench shape 181, an epitaxial growth is caused with the trench shape maintained, with the result that a trench shape 193 is generated.

Figure 9:
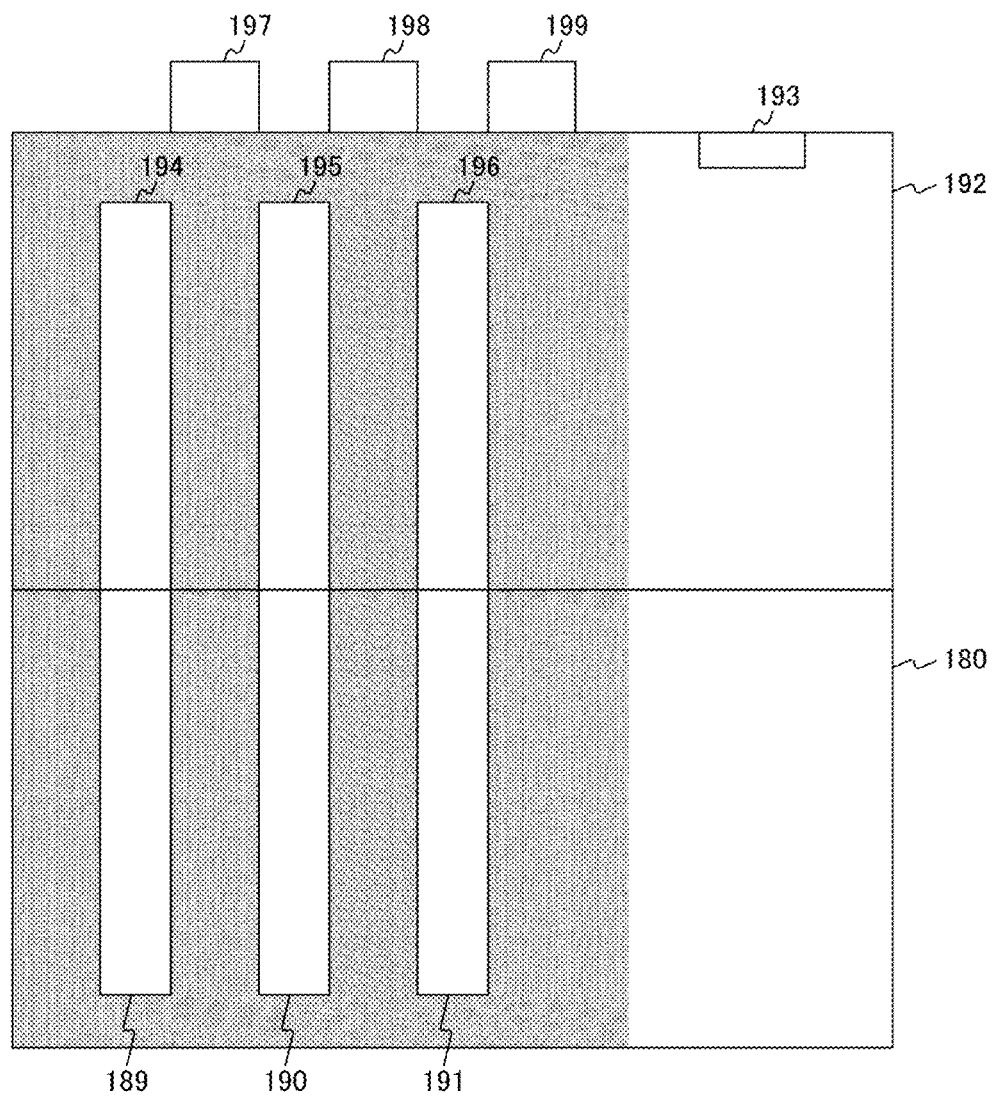
FIG. 9 A diagram showing an example of a manufacturing process of the image pickup element 100 according to the first embodiment of the present technology.

FIG. 9 shows a pixel transistor formation process and a wiring process. For example, second photodiodes 194 to 196 are formed, and pixel transistors 197 to 199 are formed. Further, wirings are formed.

Figure 10:
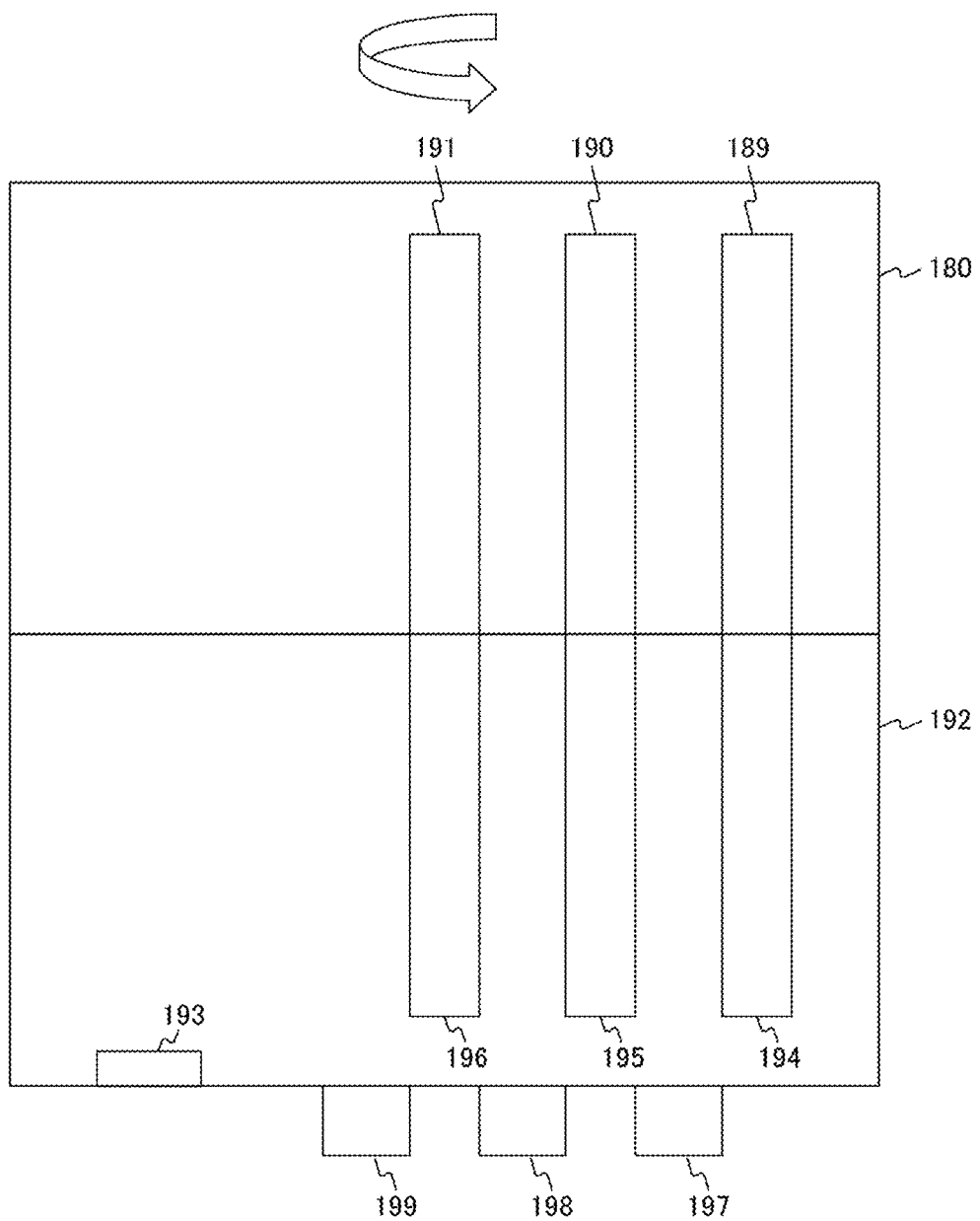
FIG. 10 A diagram showing an example of a manufacturing process of the image pickup element 100 according to the first embodiment of the present technology.

FIG. 10 shows a back-surfacing process. It should be noted that, in FIG. 3 to FIG. 10, for ease of explanation, an example of the photodiode formation in the case where the pupil correction is not performed for the photodiode is shown. In the case where the pupil correction is performed for the photodiode, in the manufacturing processes shown in FIG. 3 to FIG. 10, the photodiode opening portions are shifted as shown in FIG. 1 and FIG. 2. That is, as shown in FIG. 1 and FIG. 2, by shifting the areas of the photodiode opening portions in accordance with the shift amount described above, the pupil correction can be performed for the photodiode. In this way, in the first embodiment of the present technology, the image pickup element is manufactured in such a manner that the intervals between the adjacent photodiodes on the light receiving surface of the image pickup element are changed depending on the positions on the light receiving surface of the image pickup element. As a result, it is possible to suppress color mixing and shading.

Here, in the CMOS sensor (including infrared ray sensor), to obtain the sensitivity, it is necessary to increase the length (depth) of the photodiodes (length in an optical axis direction). However, if the length of the photodiode is increased, due to obliquely incident light, color mixing may occur. In view of this, in the first embodiment of the present technology, the silicon epitaxial process is used to layer the photodiodes, thereby performing the pupil correction for the photodiode.

For example, as shown in FIG. 1, to the peripheral portion on the light receiving surface of the image pickup element 100, light beams L11 to L13 are incident thereon obliquely. In this case, it is also possible to suppress color mixing due to the obliquely incident light beams L11 to L13, because the photodiodes are subjected to the pupil correction. Further, it is possible to increase the sensitivity of the image pickup element 100.

In this way, according to the first embodiment of the present technology, it is possible to perform the pupil correction for the photodiodes. Further, because the pupil correction can be performed for the photodiodes, it is possible to improve the degree of freedom of correction amounts of the OCLs and the OCCFs.

Here, for example, an image pickup element having two-stage chips exists. However, the image pickup element having the two-stage chips involves a sensitivity loss in a wiring layer area thereof. Therefore, a reduction in sensitivity loss is important.

Further, a front-surface irradiation type CMOS sensor exists in which photodiodes are obliquely shifted by repeatedly performing lithography and ion injection. In the front-surface irradiation type CMOS sensor, a pixel pitch, a pixel transistor, a pixel sharing method, and the like determine a photodiode opening position. Therefore, an asymmetric arrangement is caused, so the photodiodes are difficult to be disposed on optimal positions with respect to the OCLs and the OCCFs to be subjected to the pupil correction. Thus, there is a fear that further color mixing may be caused.

In contrast, in the first embodiment of the present technology, for the OCLs, the OCCF, the inter-pixel light shielding films, metal wirings, and the like, the pupil correction is performed, and the pupil correction can also be performed for the photodiodes. As a result, it is possible to suppress color mixing and shading.

Further, in the case where the photodiodes are formed by ion injection, due to energy rate controlling of an ion injection apparatus, it may be impossible to form deep photodiodes. In contrast, in the first embodiment of the present technology, the silicon epitaxial process and the ion injection are repeatedly performed, the thickness of silicon films of the photodiodes can be increased. That is, deep photodiodes can be formed. As a result, it is possible to increase the sensitivity with respect to infrared rays and near infrared rays. Further, the pupil correction can be performed for the photodiodes (opening portions), and thus color mixing and shading can be suppressed.

As described above, for the inter-pixel light shielding films and the lenses (OCLs and OCCFs), the linear correction (or nonlinear correction) is performed, and also for the photodiodes, the linear correction (or nonlinear correction) is performed. Further, by performing the linear correction (or nonlinear correction) for the inter-pixel light shielding films, the lenses (OCLs and OCCFs), and the photodiodes, it is possible to achieve the image pickup element that has resistance to color mixing and shading. That is, it is possible to improve image quality of image data generated by the image pickup element. Further, it is possible to eliminate a limitation with respect to the film thickness.

2. Second Embodiment

In the first embodiment of the present technology, the example of the image pickup element such as the back-surface irradiation type COMS sensor is described. In a second embodiment of the present technology, described is an example of the image pickup element such as a front-surface irradiation type CMOS sensor.

[Configuration Example of Image Pickup Element]

Figure 11:
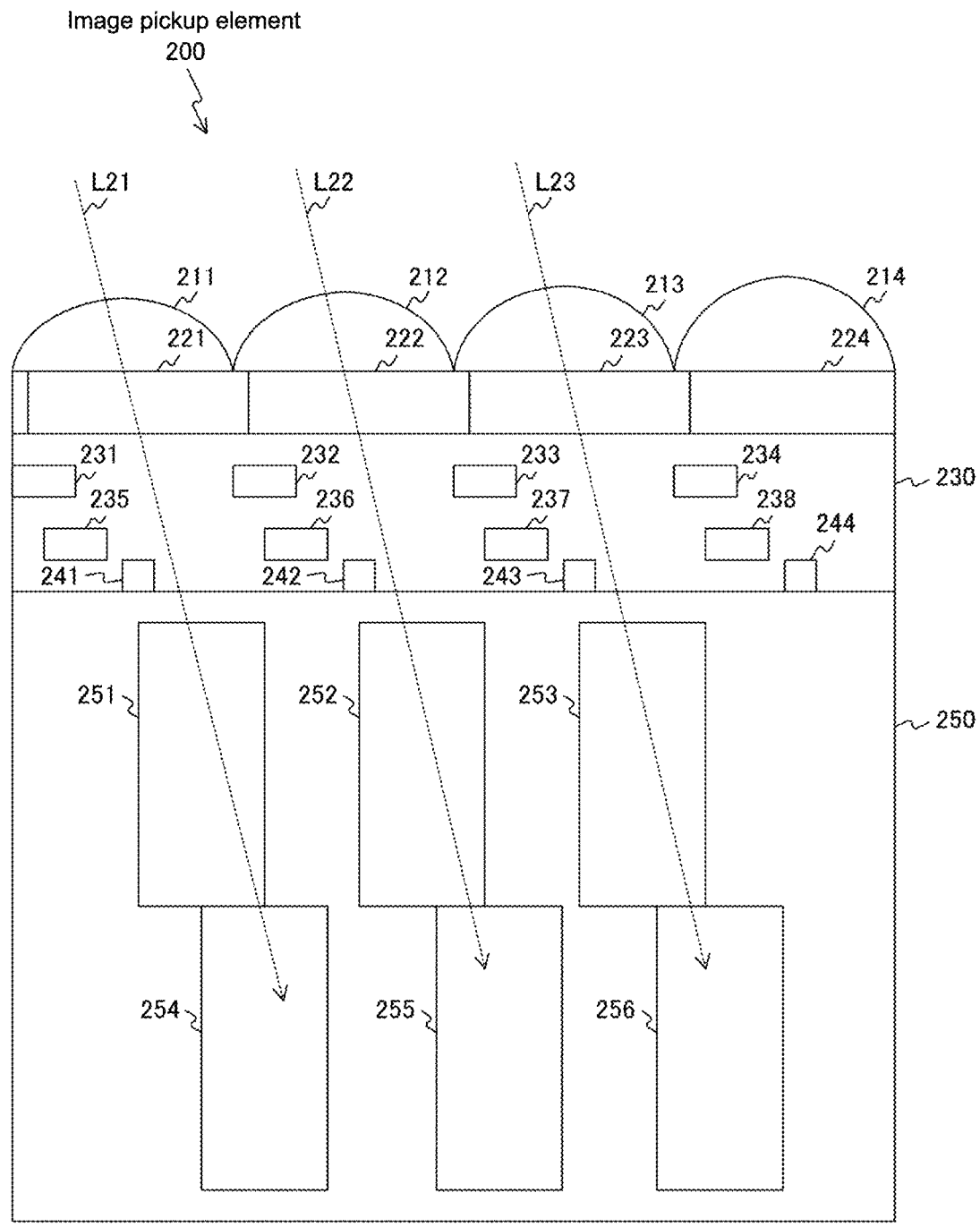
FIG. 11 A cross-sectional view showing a configuration example of an image pickup element 200 according to a second embodiment of the present technology.

FIG. 11 is a cross-sectional view showing a configuration example of an image pickup element 200 according to the second embodiment of the present technology. FIG. 11 shows a configuration example of a peripheral portion (area on a peripheral side on light receiving surface) of the image pickup element 200.

The image pickup element 200 is provided with OCLs 211 to 214, OCCFs 221 to 224, metal wirings 231 to 238, pixel transistors 241 to 244, and photodiodes 251 to 256. The image pickup element 200 is achieved by a front-surface irradiation type CMOS sensor, for example.

The OCLs 211 to 214, the OCCFs 221 to 224, the pixel transistors 241 to 244, and the photodiodes 251 to 256 correspond to the portions having the same names shown in FIG. 1. Therefore, detailed description of those will be omitted.

[Example of Manufacturing Process of Image Pickup Element]

Figure 12:
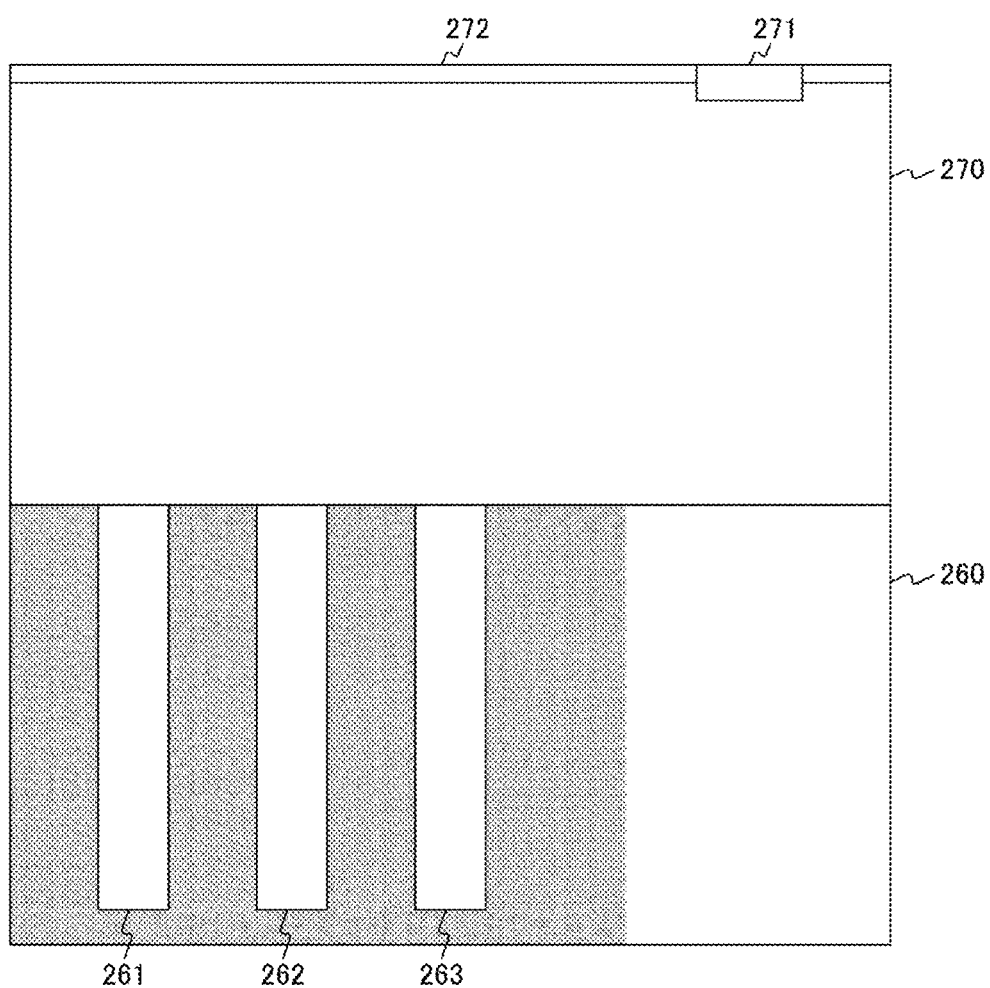
FIG. 12 A diagram showing an example of a manufacturing process of the image pickup element 200 according to the second embodiment of the present technology.
Figure 13:
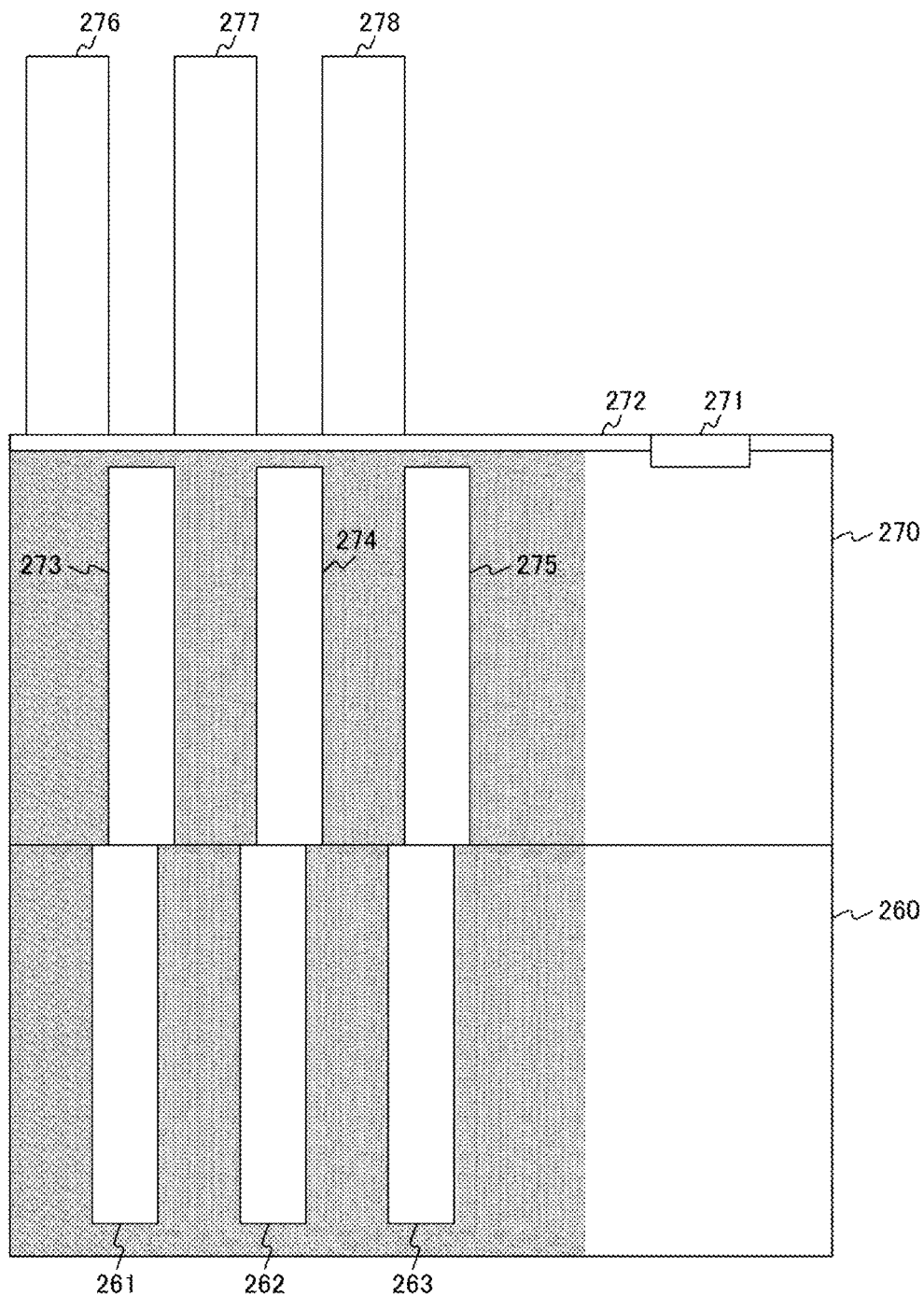
FIG. 13 A diagram showing an example of a manufacturing process of the image pickup element 200 according to the second embodiment of the present technology.

FIG. 12 and FIG. 13 are diagrams each showing an example of a manufacturing process of the image pickup element 200 according to the second embodiment of the present technology. It should be noted that the manufacturing process of the image pickup element 200 is common to the manufacturing process (first photodiode formation process) shown in FIG. 3 to FIG. 8, so only a manufacturing process subsequent to the process shown in FIG. 3 to FIG. 8 will be described here.

FIG. 12 shows a surface oxidization process that is performed after the silicon epitaxial process shown in FIG. 8. For example, the surface of the epitaxial layer 192 formed by the silicon epitaxial process is oxidized, thereby forming an oxide film 272. It should be noted that first photodiodes 261 to 263 and a trench shape 271 correspond to the first photodiodes 189 to 191 and the trench shape 193 shown in FIG. 8, respectively.

FIG. 13 shows a photodiode formation process. For example, N-type regions of photodiodes (first photodiodes 261 to 263) are formed, and P-type regions 273 to 275 of the photodiodes are formed, and resists 276 to 278 are formed.

3. Third Embodiment

In the first and second embodiments of the present technology, the examples of the two-stage silicon epitaxial image pickup elements are shown. In a third embodiment of the present technology, an example of a multistage silicon epitaxial image pickup element having three or more stages.

[Configuration Example of Image Pickup Element]

Figure 14:
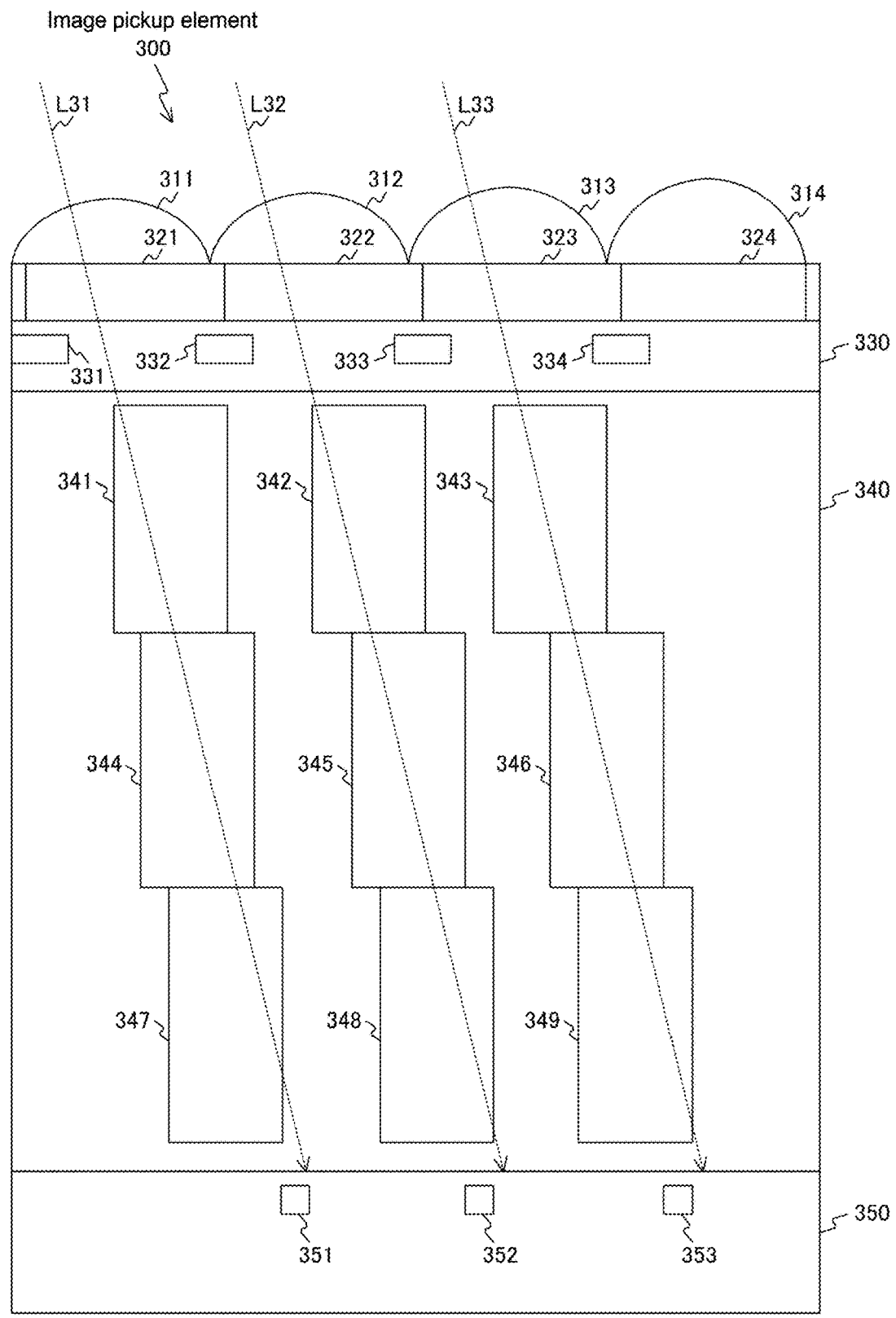
FIG. 14 A cross-sectional view showing a configuration example of an image pickup element 300 according to a third embodiment of the present technology.

FIG. 14 is a cross-sectional view showing a configuration example of an image pickup element 300 in a third embodiment of the present technology. FIG. 14 shows a configuration example of a peripheral portion (area on a peripheral side on light receiving surface) of the image pickup element 300.

The image pickup element 300 is provided with OCLs 311 to 314, OCCFs 321 to 324, inter-pixel light shielding films 331 to 334, photodiodes 341 to 349, and pixel transistors 351 to 353. It should be noted that those correspond to the portions having the same names shown in FIG. 1. Therefore, a detailed description of those will be omitted.

Further, a manufacturing process of the image pickup element 300 is different in that the pattern of the photolithography process is changed, and positions of photodiodes are shifted, but the remaining process is common to that shown in FIG. 3 to FIG. 10. Thus, a detailed description thereof will be omitted here.

[Configuration Example of Image Pickup Element]

Figure 15:
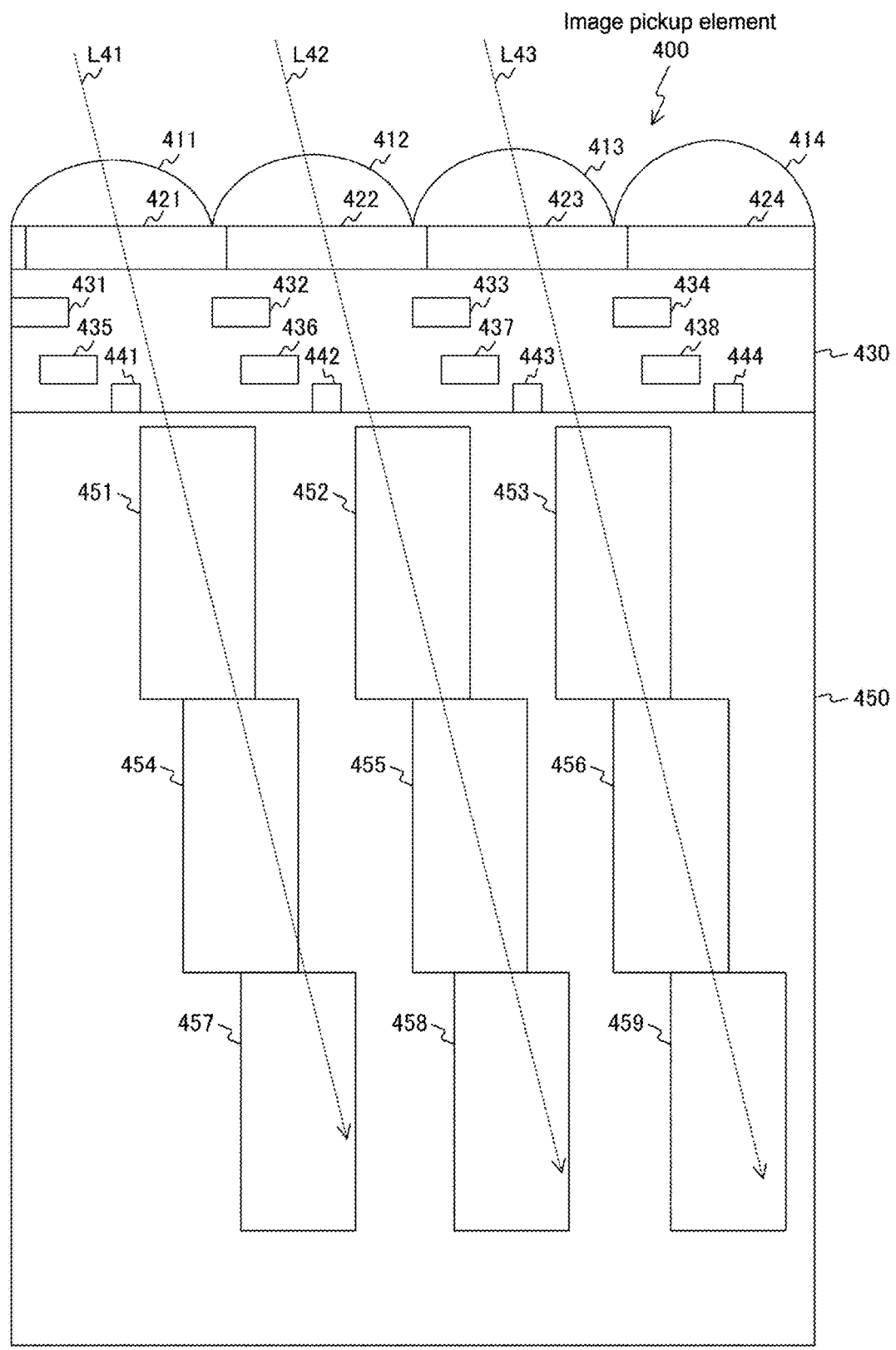
FIG. 15 A cross-sectional view showing a configuration example of an image pickup element 400 according to the third embodiment of the present technology.

FIG. 15 is a cross-sectional view showing a configuration example of an image pickup element 400 in the third embodiment of the present technology. FIG. 15 shows a configuration example of a peripheral portion (area on a peripheral side on light receiving surface) of the image pickup element 400.

The image pickup element 400 is provided with OCLs 411 to 414, OCCFs 421 to 424, metal wirings 431 to 438, pixel transistors 441 to 444, and photodiodes 451 to 459. It should be noted that those correspond to the portions having the same names shown in FIG. 11. Therefore, a detailed description of those will be omitted.

Further, the manufacturing process of the image pickup element 400 is different in that the pattern of the photolithography process is changed, and the positions of the photodiodes are shifted, but the remaining process is common to that shown in FIG. 3 to FIG. 8, FIG. 12, and FIG. 13. Therefore, a detailed description of those will be omitted.

It should be noted that in the embodiments of the present technology, the examples of the image pickup elements 100, 200, 300, and 400 are shown. For the image pickup apparatus provided with the image pickup element 100, 200, 300, or 400, it is also possible to apply the embodiments of the present technology. Further, it is also possible to apply the embodiments of the present technology to an electronic apparatus such as a smartphone, a tablet terminal, and a personal computer, and an information processing apparatus.

It should be noted that the above embodiments are merely examples for embodying the present technology, and matters in the embodiments and matters to define the invention in claims have corresponding relationship. Similarly, the matters to define the invention in claims and matters denoted by the same names in the embodiments of the present technology have corresponding relationship. However, the present technology is not limited to the embodiments and can be embodied by variously modifying the embodiments without departing from the gist of the present technology.

It should be noted that the effects described in this description are merely examples and are not limited. Further, other effects may be exerted.

It should be noted that, the present technology can take the following configurations.

(1) An image pickup element, in which
an interval between adjacent light receiving elements on a light receiving surface is changed depending on a position on the light receiving surface.

(2) The image pickup element according to (1),
the image pickup element being a back-surface irradiation type COMS (Complementary Metal Oxide Semiconductor) sensor, in which
the light receiving elements are formed in such a manner that the adjacent light receiving elements are arranged at an equal interval on a pixel transistor side, and the light receiving elements are formed in such a manner that the adjacent light receiving elements are arranged at different intervals depending on positions on the light receiving surface on a light incident side.

(3) The image pickup element according to (1) or (2), in which
the light receiving elements are formed along light paths of light incident from opening portions of the light receiving elements.

(4) The image pickup element according to any one of (1) to (3), in which
the light receiving elements are divided into pieces and silicon-epitaxially formed.

(5) The image pickup element according to any one of (1) to (4), in which
the intervals between the adjacent light receiving elements are linearly or nonlinearly changed from a center of the light receiving surface toward field angle ends.

(6) The image pickup element according to any one of (1) to (5), in which
an interval between inter-pixel light shielding films disposed between the adjacent light receiving elements is changed depending on a position on the light receiving surface.

(7) The image pickup element according to any one of (1) to (6), in which
an interval between lenses disposed on the light receiving elements is changed depending on a position on the light receiving surface.

(8) An image pickup apparatus, including:
an image pickup element in which an interval between adjacent light receiving elements on a light receiving surface is changed depending on a position on the light receiving surface.

(9) A method of manufacturing an image pickup element, including:
layering photodiodes by repeatedly performing a silicon epitaxial process and an ion injection process; and
changing an interval between the photodiodes adjacent on a light receiving surface of an image pickup element in each layer depending on a position on the light receiving surface.

REFERENCE SIGNS LIST 100, 200, 300, 400 image pickup element
111 to 114, 211 to 214, 311 to 314, 411 to 414 OCL
121 to 124, 221 to 224, 321 to 324, 421 to 424 OCCF
131 to 134, 331 to 334 inter-pixel light shielding film
141 to 146 photodiode
151 to 153, 241 to 244, 351 to 353, 441 to 444 pixel transistor
160 pixel area
170 pixel
171 photodiode opening portion
231 to 238, 431 to 438 metal wiring

The invention claimed is:

1. A light detecting device comprising:
a first pixel unit comprising a first lens and a first photoelectric conversion element, and
a second pixel unit comprising a second lens and a second photoelectric conversion element,
wherein the first pixel unit and the second pixel unit are positioned in an array of pixel units at different distances from a center of the array of pixel units,
wherein a center of the first lens and a center of a first adjacent lens in the array of pixel units are separated by a first distance in a plan view, and a center of the second lens and a center of a second adjacent lens in the array of pixel units are separated by a second distance in the plan view, and
wherein the first distance and the second distance are different.

2. The light detecting device according to claim 1, further comprising first and second color filters disposed below the first and second lenses, respectively, wherein a center of the first lens color filter and a center of the first photoelectric conversion element are separated by a third distance and a center of the second color filter and a center of the second photoelectric conversion element are separated by a fourth distance, and wherein the third distance and the fourth distance are different.

3. The light detecting device according to claim 1, wherein the first pixel unit is positioned near the center of the array of pixel units and the second pixel unit is positioned near a periphery of the array of pixel units and wherein the first distance is larger than the second distance.

4. The light detecting device according to claim 1, wherein the first and second photoelectric conversion elements each include a first section and a second section below the first section and wherein a center of the second section is separated from a center of the first section in a horizontal direction in the plan view.

5. The light detecting device according to claim 1, further comprising inter-pixel light shielding films disposed between the first and second lenses and the first and second photoelectric conversion elements.

* * * * *